(12) United States Patent
Kawamura et al.

(10) Patent No.: US 11,139,105 B2
(45) Date of Patent: Oct. 5, 2021

(54) COIL COMPONENT AND ELECTRONIC DEVICE

(71) Applicant: TAIYO YUDEN CO., LTD., Tokyo (JP)

(72) Inventors: Keizo Kawamura, Takasaki (JP); Jun Ogasawara, Takasaki (JP); Toshimasa Suzuki, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 435 days.

(21) Appl. No.: 16/221,285

(22) Filed: Dec. 14, 2018

(65) Prior Publication Data

US 2019/0198231 A1    Jun. 27, 2019

(30) Foreign Application Priority Data

Dec. 27, 2017 (JP) ............................. JP2017-252521
Jul. 23, 2018 (JP) ............................. JP2018-137384

(51) Int. Cl.
| | |
|---|---|
| *H01F 27/24* | (2006.01) |
| *H01F 27/29* | (2006.01) |
| *H01F 17/04* | (2006.01) |
| *H01F 41/076* | (2016.01) |
| *H01F 27/28* | (2006.01) |
| *H05K 1/18* | (2006.01) |
| *H05K 3/34* | (2006.01) |
| *H01F 27/32* | (2006.01) |

(52) U.S. Cl.
CPC ......... *H01F 27/292* (2013.01); *H01F 17/045* (2013.01); *H01F 27/24* (2013.01); *H01F 27/2823* (2013.01); *H01F 27/327* (2013.01); *H01F 41/076* (2016.01); *H05K 1/181* (2013.01); *H05K 3/3431* (2013.01); *H01F 2017/048* (2013.01); *H05K 2201/1003* (2013.01)

(58) Field of Classification Search
CPC .... H01F 27/292; H01F 27/327; H01F 17/045; H01F 41/076; H01F 27/2823; H01F 27/24; H01F 2017/048; H01F 27/2828; H01F 27/29; H01F 17/04; H05K 3/3431; H05K 1/181; H05K 2201/1003; Y02P 70/50

See application file for complete search history.

(56) References Cited

U.S. PATENT DOCUMENTS

| | | | |
|---|---|---|---|
| 9,076,586 B2 * | 7/2015 | Atsumi | ................. H01F 27/292 |
| 9,536,653 B2 * | 1/2017 | Yamada | ................. H01F 41/071 |
| 2017/0186531 A1 * | 6/2017 | Ohtsubo | ............. H01F 27/2828 |

FOREIGN PATENT DOCUMENTS

JP            2005191403 A        7/2005

* cited by examiner

*Primary Examiner* — Tuyen T Nguyen
(74) *Attorney, Agent, or Firm* — Law Office of Katsuhiro Arai

(57) ABSTRACT

In an exemplary embodiment, a coil component includes: an element body part 10; a coil 40 embedded within the element body part 10 and constituted by a wound conductive wire; lead wires 44a, 44b that are each extended from the conductive wire and led out from the coil 40, and whose tip parts 46a, 46b are each fixed to a bottom face 22 of the element body part 10; and terminal parts 70a, 70b that are each constituted by the tip part 46a or 46b and a metal member 72a or 72b that is joined to the tip part 46a or 46b on the bottom face 22, and also has an opening 74 or 76 at a position overlapping the tip part 46a or 46b in a direction intersecting the bottom face 22.

15 Claims, 12 Drawing Sheets

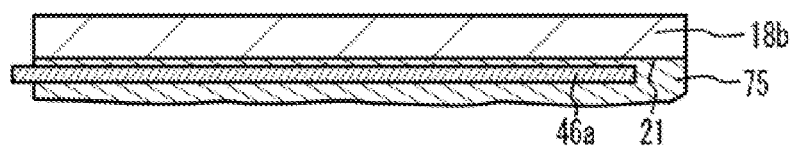

COIL COMPONENT AND ELECTRONIC DEVICE

BACKGROUND

Field of the Invention

The present invention relates to a coil component and an electronic device.

Description of the Related Art

Preferably coil components used in automobiles and industrial machinery have high reliability against vibration. Accordingly, coil components designed to improve vibration reliability are known, wherein metal plates are joined to lead wires that have been led out onto side faces of the element body part, and these metal plates are bent in such a way that they extend from the side faces to the bottom face of the element body part (Patent Literature 1, for example).

BACKGROUND ART LITERATURES

[Patent Literature 1] Japanese Patent Laid-open No. 2005-191403

SUMMARY

In the case of the coil component described in Patent Literature 1, however, the terminal parts, each including the lead wire and the metal plate, are bent in such a way that they extend from the side faces, to the bottom face, of the element body part, and thus are not fixed to the element body part. This means that, when vibration is applied to the coil component in a state where the terminal parts are joined to electrodes on a circuit board, a large force will apply to the area of each lead wire that has been led out onto the exterior of the element body part from the side face of the element body part, and the wire may disconnect in this area.

The present invention was developed in light of the aforementioned problems, and its object is to improve the vibration reliability.

Any discussion of problems and solutions involved in the related art has been included in this disclosure solely for the purposes of providing a context for the present invention, and should not be taken as an admission that any or all of the discussion were known at the time the invention was made.

The present invention is a coil component, comprising: an element body part formed containing a magnetic material; a coil built into the element body part and constituted by a wound conductive wire; lead wires that are each a part of the conductive wire led out from the coil, and whose tip parts are each fixed to the element body part on a first face among the surfaces of the element body part; and terminal parts that are each constituted in a manner including the tip part of the lead wire and a metal member joined to the tip part of the lead wire; wherein the metal member is joined to the tip part of the lead wire on the first face of the element body part and also has an opening at a position that overlaps the tip part of the lead wire in the direction perpendicular to the first face of the element body part.

The aforementioned constitution may be such that the tip part of the lead wire is embedded in the element body part on the first face of the element body part and thereby fixed to the element body part on the first face of the element body part.

The aforementioned constitution may be such that the tip part of the lead wire is fixed to the first face of the element body part via a solder.

The aforementioned constitution may be such that the tip part of the lead wire extends along the first face of the element body part.

The aforementioned constitution may be such that the metal member has multiple openings that each correspond to the aforementioned opening.

The aforementioned constitution may be such that the metal member has a solder filled in the opening and that the terminal part is constituted in a manner including the tip part of the lead wire, the metal member, and the solder.

The aforementioned constitution may be such that the lead wires are each constituted by the tip part, and a relay part between the coil and the tip part, and that the tip part and relay part are both embedded in the element body part.

The aforementioned constitution may be such that the relay parts of the lead wires are led out vertically to the first face of the element body part, from the coil toward the first face of the element body part.

The aforementioned constitution may be such that, of the metal member, the part positioned on the first face of the element body part is embedded in the element body part.

The aforementioned constitution may be such that the surface of the part of the metal member positioned on the first face of the element body part is roughly flush with the first face of the element body part.

The aforementioned constitution may be such that the metal member extends from the first face, to a second face that intersects the first face, among the surfaces of the element body part, and is placed on the exterior of the element body part on the second face.

The aforementioned constitution may be such that the element body part includes a drum core that includes a winding shaft, and a pair of flange parts provided at both ends of the winding shaft in the axial direction; and a resin part provided between the pair of flange parts, and the coil is formed by the conductive wire being wound around the winding shaft, and is surrounded by the drum core and the resin part.

The aforementioned constitution may be such that the element body part is formed by a drum core that includes a winding shaft, and a pair of flange parts provided at both ends of the winding shaft in the axial direction, and the coil is formed by the conductive wire being wound around the winding shaft.

The aforementioned constitution may be such that the ratio of the height of the drum core to the length of a principal face, in the long direction, of the flange part constituting the drum core, is smaller than 1.

The present invention is an electronic device, comprising: a coil component according to the foregoing; and a circuit board on which the coil component is mounted; wherein the terminal parts of the coil component are joined to the electrodes provided on the circuit board.

According to the present invention, vibration reliability can be improved.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

Figure 1C:
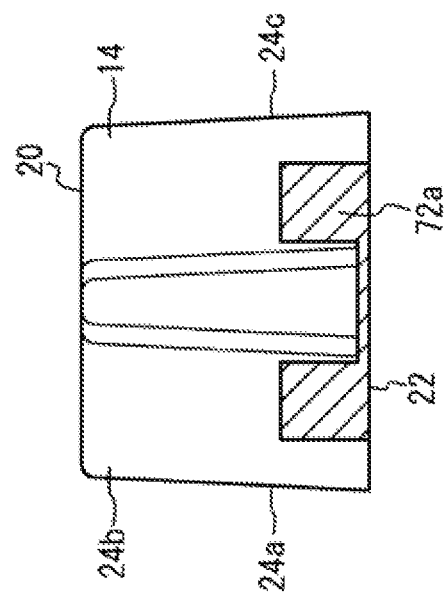
FIGS. 1C and 1D are side views, of the coil component pertaining to Example 1.

DESCRIPTION OF THE SYMBOLS 10, 10a Element body part
11 Drum core
12, 14 Magnetic body part
16 Winding shaft
18, 18a, 18b Flange part
19 Resin part
20 Top face
21 Bottom face
22 Bottom face
23 Concave
24a to 24d Side face
26 Concave
40 Coil
44a, 44b Lead wire
46a, 46b Tip part
47a, 47b Portion positioned at opening
48a, 48b Relay part
70a, 70b Terminal part
72a, 72b Metal member
74, 76 Opening
75, 77, 78, 79 Solder
80 Circuit board
82 Electrode
84 Mounting solder
90a, 90b Terminal part
92a, 92b Metal member
94a, 94b Lead wire
96a, 96b Area
100 to 520 Coil component
600 Electronic device
800 Coil component

DETAILED DESCRIPTION OF EMBODIMENTS

Examples of the present invention are explained below by referring to the drawings.

Example 1

Figure 1D:
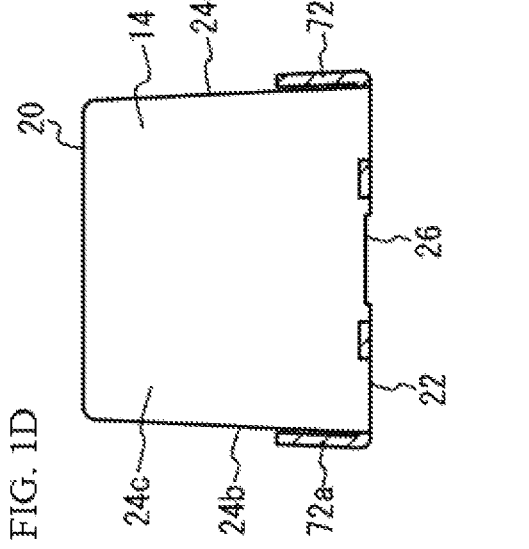
Figure 1A:
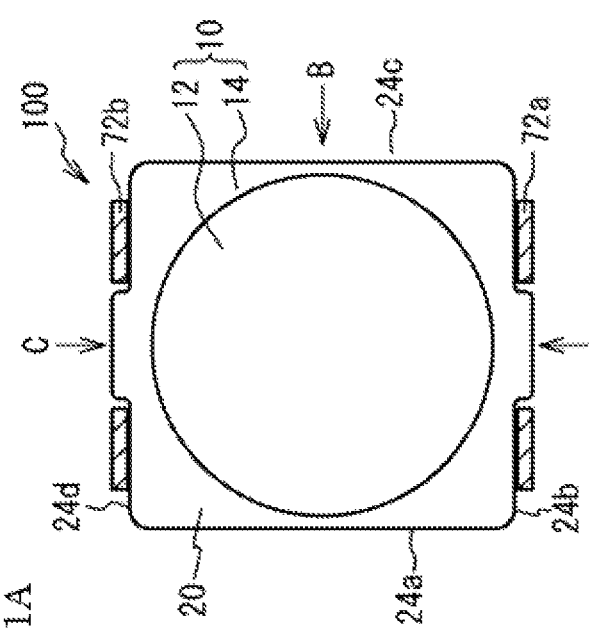
FIG. 1A is a top view.
Figure 1B:
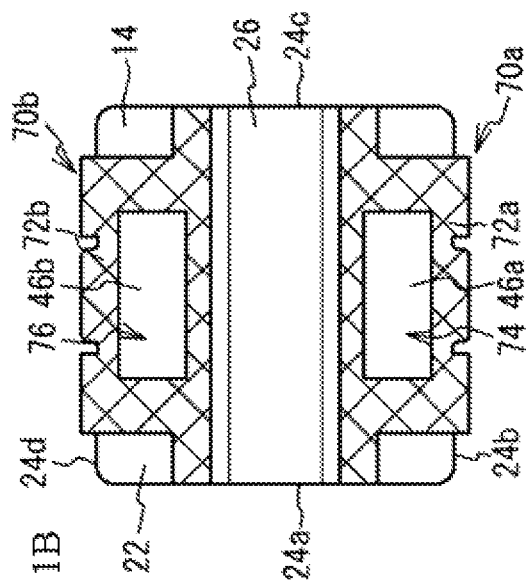
FIG. 1B is a bottom view.
Figure 2A:
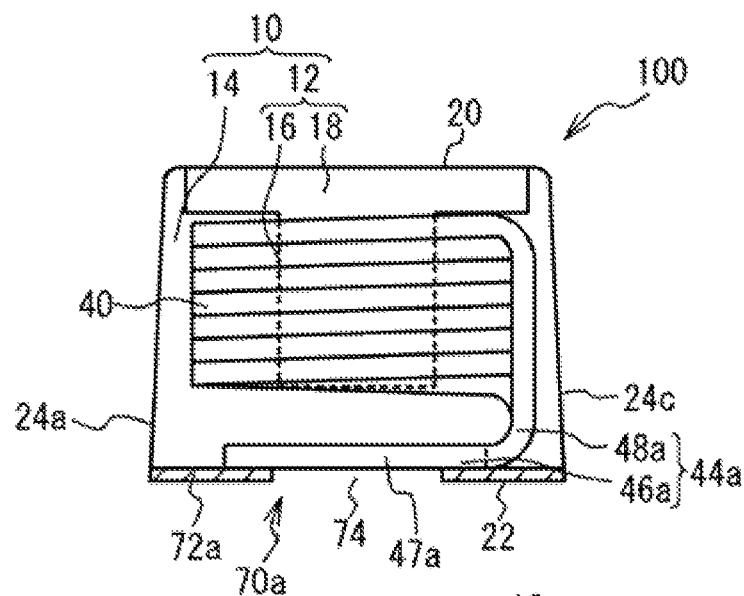
FIGS. 2A to 2C are perspective side views of the interior of the coil component pertaining to Example 1.
Figure 2B:
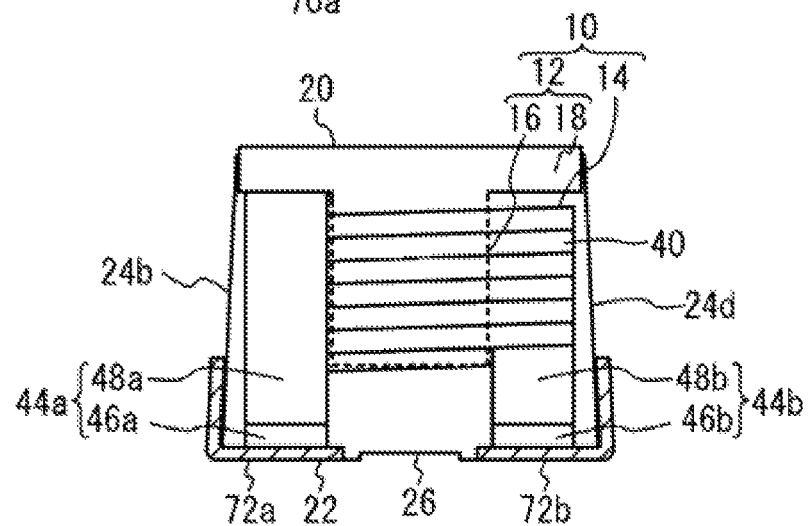
Figure 2C:
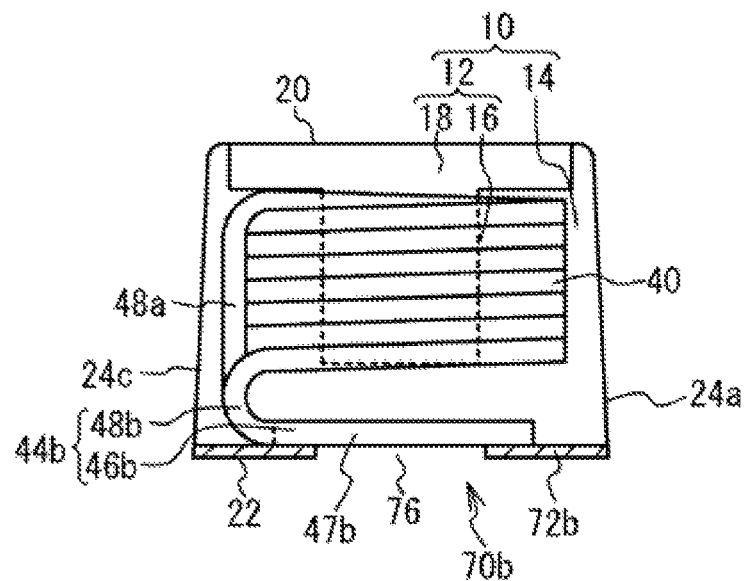
Figure 3A:
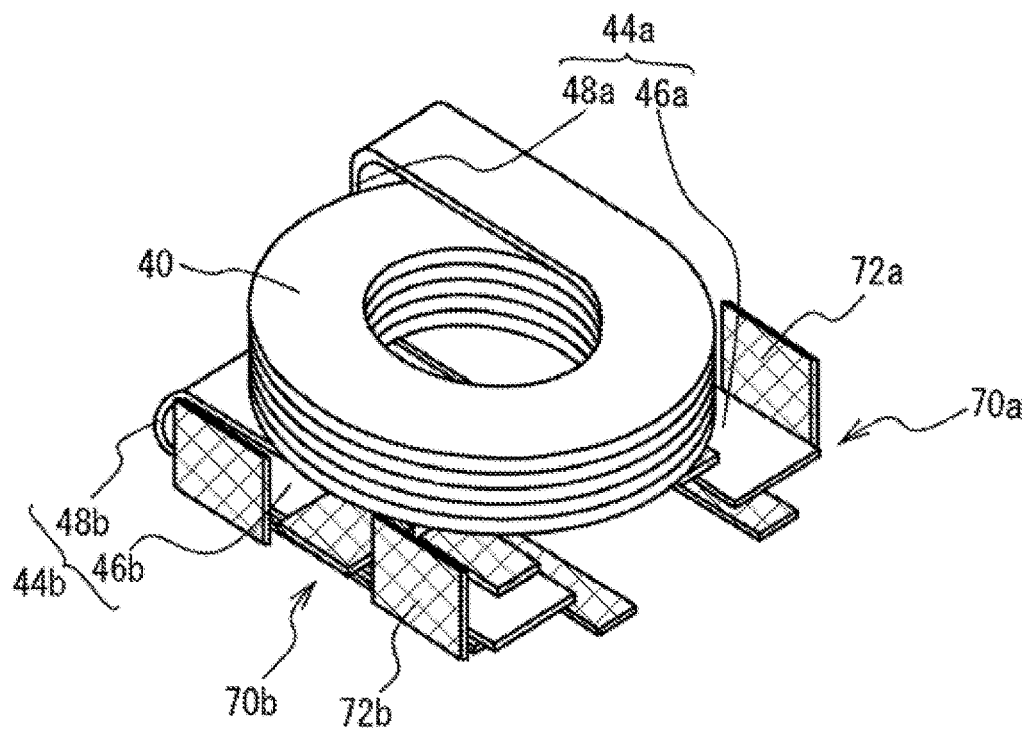
FIGS. 3A and 3B are perspective views of the coil and terminal parts.
Figure 3B:
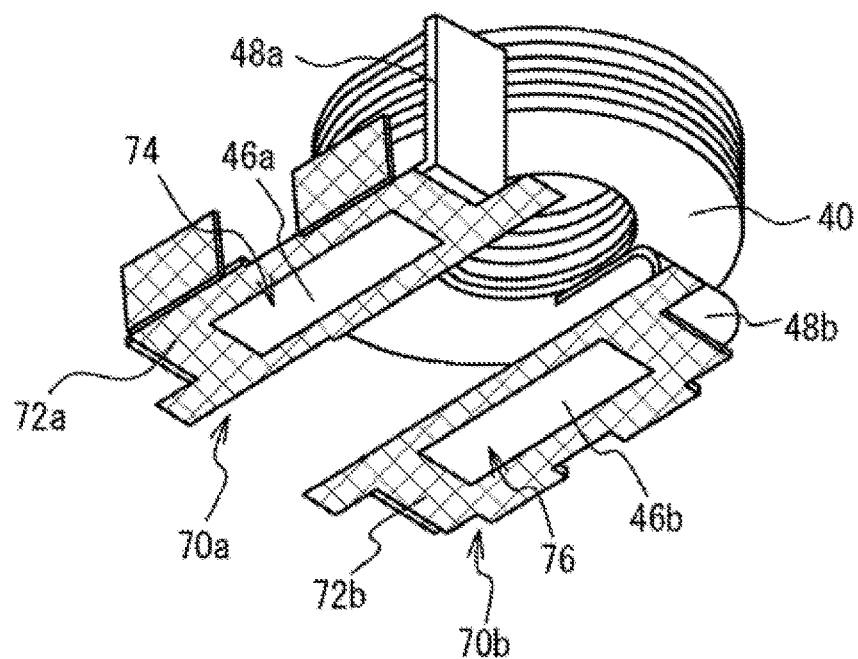

FIG. 1A is a top view, FIG. 1B is a bottom view, and FIGS. 1C and 1D are side views, of the coil component pertaining to Example 1. FIG. 1C is a side view of FIG. 1A from direction A, while FIG. 1D is a side view of FIG. 1A from direction B. FIGS. 2A to 2C are perspective side views of the interior of the coil component pertaining to Example 1. FIG. 2A is a perspective side view of the interior of what is shown in FIG. 1A from direction A, FIG. 2B is a perspective side view of the interior of what is shown in FIG. 1A from direction B, and FIG. 2C is a perspective side view of the interior of what is shown in FIG. 1A from direction C. FIGS. 3A and 3B are perspective views of the coil and terminal parts. It should be noted that, in FIGS. 1A to 1D, FIGS. 2A to 2C, and FIGS. 3A and 3B, the metal members are hatched for illustrative clarity. As shown in FIGS. 1A to 1D, FIGS. 2A to 2C, and FIGS. 3A and 3B, the coil component 100 in Example 1 has an element body part 10, a coil 40, lead wires 44a, 44b, a terminal part 70a that includes the tip part 46a of the lead wire 44a, and a terminal part 70b that includes the tip part 46b of the lead wire 44b.

The element body part 10 contains a magnetic material, and is constituted by magnetic body parts 12, 14, each having a different magnetic permeability. For example, the magnetic permeability of the magnetic body part 12 is higher than the magnetic permeability of the magnetic body part 14. The magnetic body part 12 includes a winding shaft 16, and a flange part 18 provided at one end of the winding shaft 16 in the axial direction. The winding shaft 16 has a columnar shape, for example, while the flange part 18 has a disk shape having a thickness in the axial direction of the winding shaft 16, for example.

The magnetic body part 12 is formed by a ferrite material, magnetic metal material, or resin containing magnetic metal grains, for example. For example, the magnetic body part 12 is formed by Ni—Zn, Mn—Zn, or other ferrite, Fe—Si—Cr, Fe—Si—Al, Fe—Si—Cr—Al, or other soft magnetic alloy, Fe, Ni, or other magnetic metal, amorphous magnetic metal, nanocrystal magnetic metal, or resin containing magnetic metal grains. If the magnetic body part 12 is formed by a soft magnetic alloy, magnetic metal, amorphous magnetic metal, or nanocrystal magnetic metal, the constituent grains thereof may be insulated.

The magnetic body part 14 is formed by a resin containing magnetic metal grains, for example, but it may also be formed by a ferrite material or magnetic metal material.

The element body part 10 has a square pyramid shape, for example. The top face 20 of the element body part 10 has a length per side of approx. 3.8 mm, for example, and is shaped as a square with rounded corners. The bottom face 22 of the element body part 10 has a length per side of approx. 4.1 mm, for example, and is shaped as a square with rounded corners. The height (length between the top face 20 and the bottom face 22) of the element body part 10 is approx. 3.0 mm, for example. The bottom face 22 is a mounting surface to be mounted on a circuit board, while the top face 20 is the face on the opposite side of the bottom face 22. The faces connected to the bottom face 22 and top face 20 are side faces 24a to 24d.

The coil 40 is formed by a conductive wire being wound around the winding shaft 16 of the magnetic body part 12. Both ends of this conductive wire are led out from the coil 40 to become a pair of lead wires 44a, 44b. The conductive wire is a metal wire whose surface is covered with an insulating sheath, for example. The material for the metal wire may be copper, copper alloy, silver, or palladium, for example. The material for the insulating sheath may be polyester imide or polyamide, for example. The coil 40 is, for example, but not limited to, an edgewise-wound conductive wire being a rectangular wire having a rectangular cross-sectional shape. The conductive wire may be a round wire, etc., having a circular shape, while the coil 40 may be alpha-wound or wound in a different method.

The coil 40 is built into the element body part 10 and not exposed onto the exterior of the element body part 10. The lead wires 44a, 44b are led out from the coil 40 toward the bottom face 22 of the element body part 10 inside the element body part 10, and bent near the bottom face 22 of the element body part 10 so that they run in parallel with the bottom face 22. As a result, a tip part 46a of the lead wire 44a having a prescribed length from the tip, and a tip part 46b of the lead wire 44b having a prescribed length from the tip, extend along the bottom face 22 in parallel with the bottom face 22 of the element body part 10. The tip part 46a of the lead wire 44a, and the tip part 46b of the lead wire 44b, are embedded in the element body part 10 on the bottom face 22 of the element body part 10 and thereby fixed to the element body part 10. It should be noted that "the tip parts 46a, 46b are embedded in the element body part 10" does not only mean the tip parts 46a, 46b are entirely and completely embedded in the element body part 10, but it also means they are embedded in the element body part 10 while partially exposed onto or projecting from the element body part 10. "In parallel" does not only mean the tip part 46a of the lead wire 44a, and the tip part 46b of the lead wire 44b, are completely parallel with the bottom face 22 of the element body part 10. It also includes situations where parallelism has shifted by a manufacturing error or so, such as cases of approximate parallelism where the tip part 46a of the lead wire 44a, and the tip part 46b of the lead wire 44b, are angled by no more than 10° with respect to the bottom face 22 of the element body part 10.

Of the lead wire 44a, a relay part 48a between the coil 40 and the tip part 46a is led out vertically to the bottom face 22 of the element body part 10, from the position at the end of winding of the coil 40 toward the bottom face 22 of the element body part 10. Of the lead wire 44b, a relay part 48b between the coil 40 and the tip part 46b is folded back and bent onto the bottom face 22 of the element body part 10 from the position at the end of winding of the coil 40. It should be noted that, in FIG. 2C, the relay part 48b of the lead wire 44b is short and thus virtually no part of it led out from the coil 40 vertically to the bottom face 22 of the element body part 10; if long, however, preferably this part is led out from the coil 40 vertically to the bottom face 22 of the element body part 10. It should be noted that "vertically" does not only mean the relay part 48a of the lead wire 44a, and the relay part 48b of the lead wire 44b, are 90° with respect to the bottom face 22 of the element body part 10. It also includes situations where 90° verticality has shifted by a manufacturing error or so, such as cases of approximate verticality corresponding to 80° to 100° with respect to the bottom face 22 of the element body part 10.

The relay part 48a of the lead wire 44a, and the relay part 48b of the lead wire 44b, are embedded in the element body part 10. It should be noted that "the relay parts 48a, 48b are embedded in the element body part 10" does not only mean the relay parts 48a, 48b are entirely and completely embedded in the element body part 10, but it also means they are embedded in the element body part 10 while partially exposed onto or projecting from the element body part 10. The lead wire 44a is not led out to the exterior of the element body part 10 because the tip part 46a and relay part 48a are embedded in the element body part 10. Similarly, the lead wire 44b is not led out to the exterior of the element body part 10 because the tip part 46b and relay part 48b are embedded in the element body part 10.

The terminal part 70a is constituted in a manner including the tip part 46a of the lead wire 44a and a plate-like metal member 72a embedded in the bottom face 22 of the element body part 10. The metal member 72a is joined, on the bottom face 22 of the element body part 10, to the tip part 46a of the lead wire 44a which is fixed to the element body part 10 on the bottom face 22 of the element body part 10. For example, the metal member 72a is joined to the side face of the tip part 46a of the lead wire 44a on the bottom face 22 side of the element body part 10. The lead wire 44a and the metal member 72a may be joined by any generally known method for joining metals, such as solder joining, laser welding, pressure bonding, ultrasonic joining, or the like. The metal member 72a is, on the bottom face 22 of the element body part 10, positioned more outward with respect to the element body part 10 than is the tip part 46a of the lead wire 44a, and it has an opening 74 at a position that overlaps the tip part 46a of the lead wire 44a in a direction intersecting (such as the direction vertical to) the bottom face 22 of the element body part 10. By this opening 74, a concave part whose underside is constituted by the tip part 46a of the lead wire 44a is formed in the metal member 72a. When the coil component 100 is mounted on a circuit board via a solder, the solder wets and spreads over the surface of the metal member 72a and also fills the opening 74, and consequently the portion 47a of the tip part 46a of the lead wire 44a positioned at the opening 74 in the metal member 72a, and the metal member 72a, together function as a terminal. The opening 74 may have any desired shape and need not be shaped as a hole whose periphery is surrounded by the metal member 72a, so long as it is shaped in such a way that the metal member 72a, and the portion 47a of the tip part 46a of the lead wire 44a positioned at the opening 74 in the metal member 72a, together function as a terminal. For example, a concave may be formed in the metal member 72a as viewed from the bottom face 22 side of the element body part 10, and the opening 74 may be formed by this concave.

Similarly, the terminal part 70b is constituted in a manner including the tip part 46b of the lead wire 44b and a plate-like metal member 72b embedded in the bottom face 22 of the element body part 10. The metal member 72b is joined, on the bottom face 22 of the element body part 10, to the tip part 46b of the lead wire 44b which is fixed to the element body part 10 on the bottom face 22 of the element body part 10. For example, the metal member 72b is joined to the side face of the tip part 46b of the lead wire 44b on the bottom face 22 side of the element body part 10. The lead wire 44b and the metal member 72b may be joined by any generally known method for joining metals, such as solder joining, laser welding, pressure bonding, ultrasonic joining, or the like. The metal member 72b is, on the bottom face 22 of the element body part 10, positioned more outward with respect to the element body part 10 than is the tip part 46b of the lead wire 44b, and it has an opening 76 at a position that overlaps the tip part 46b of the lead wire 44b in a direction intersecting (such as the direction vertical to) the bottom face 22 of the element body part 10. By this opening 76, a concave part whose underside is constituted by the tip part 46b of the lead wire 44b is formed in the metal member 72b. When the coil component 100 is mounted on a circuit board via a solder, the solder wets and spreads over the surface of the metal member 72b and also fills the opening 76, and consequently the portion 47b of the tip part 46b of the lead wire 44b positioned at the opening 76 in the metal member 72b, and the metal member 72b, together function as a terminal. The opening 76 may have any desired shape and need not be shaped as a hole whose periphery is surrounded by the metal member 72b, so long as it is shaped in such a way that the metal member 72b, and the portion 47b of the tip part 46b of the lead wire 44b positioned at the opening 76 in the metal member 72b, together function as a terminal. For example, a concave may be formed in the metal member 72b as viewed from the bottom face 22 side of the element body part 10, and the opening 76 may be formed by this concave.

The metal member 72a is embedded in the bottom face 22 of the element body part 10 and also bent onto the side face 24b of the element body part 10. The metal member 72b is embedded in the bottom face 22 of the element body part 10 and also bent onto the side face 24d of the element body part 10. It should be noted that "the metal members 72a, 72b are embedded in the element body part 10" includes a condition where the metal members 72a, 72b are embedded with their undersides exposed on the bottom face 22 of the element body part 10. So long as this condition is met, the metal members 72a, 72b may be entirely embedded in the element body part 10 except for the undersides, or they may be embedded in the element body part 10 only partially. The undersides of the metal members 72a, 72b are flush with the bottom face 22 of the element body part 10, for example. A concave 26 is formed in the part of the bottom face 22 of the element body part 10 positioned between the metal members 72a, 72b. The part of the metal member 72a bent onto the side face 24b of the element body part 10, and the part of the metal member 72b bent onto the side face 24d of the element body part 10, are not embedded in the element body part 10, but are positioned on the exterior of the element body part 10.

Preferably the metal members 72a, 72b are formed by a material having high electrical conductivity and high mechanical rigidity, and they are formed by a copper or copper alloy plate, etc., of approx. 0.02 mm to 0.2 mm in thickness, for example. Over the surfaces of the portion 47a of the tip part 46a of the lead wire 44a positioned at the opening 74 in the metal member 72a, the portion 47b of the tip part 46b of the lead wire 44b positioned at the opening 76 in the metal member 72b, and the metal members 72a, 72b, a plated, sputtered or other layer of nickel and/or tin may be provided.

The tip part 46a of the lead wire 44a, and the part of the metal member 72a positioned on the bottom face 22 of the element body part 10, are embedded in the element body part 10, which means that the part where the lead wire 44a and the metal member 72a are joined together is embedded in the element body part 10. Similarly, the tip part 46b of the lead wire 44b, and the part of the metal member 72b positioned on the bottom face 22 of the element body part 10, are embedded in the element body part 10, which means that the part where the lead wire 44b and the metal member 72b are joined together is embedded in the element body part 10.

Next, the method for manufacturing the coil component 100 in Example 1 is explained. First, a conductive wire being a rectangular wire is edgewise-wound to form a coil 40, and two lead wires 44a, 44b of appropriate lengths that are running straight and roughly in parallel, are led out from the coil 40. Next, the insulating sheath is stripped from the tip part 46a of the lead wire 44a, and from the tip part 46b of the lead wire 44b. The insulating sheath may be stripped by irradiating laser beam, for example, but it may also be stripped using a cutting knife or chemical agent.

Next, a forming process is performed to bend the lead wires 44a, 44b. After the forming process, the lead wires 44a, 44b have relay parts 48a, 48b formed by bending the coil 40, as well as tip parts 46a, 46b formed by bending the relay parts 48a, 48b, respectively.

Next, a tabular metal member 72a having an opening 74 is joined to the tip part 46a of the lead wire 44a, and a tabular metal member 72b having an opening 76 is joined to the tip part 46b of the lead wire 44b. The metal members 72a, 72b may be joined by means of solder joining, laser welding, pressure bonding or ultrasonic joining, etc., for example. As mentioned above, the portion 47a of the tip part 46a of the lead wire 44a positioned at the opening 74 in the metal member 72a, and the metal member 72a, together function as a terminal. The portion 47b of the tip part 46b of the lead wire 44b positioned at the opening 76 in the metal member 72b, and the metal member 72b, together function as a terminal. As a result, a terminal part 70a constituted in a manner including the tip part 46a of the lead wire 44a and the metal member 72a, and a terminal part 70b constituted in a manner including the tip part 46b of the lead wire 44b and the metal member 72b, are formed.

Next, a magnetic body part 12 having a winding shaft 16 and a flange part 18 is installed to the coil 40 in such a way that the winding shaft 16 is inserted into the hollow part of the coil 40. At this time, the flange part 18 is positioned on the opposite side, to the metal members 72a, 72b, of the coil 40.

Next, the coil 40 to which the magnetic body part 12 has been installed is placed inside a die. Then, a liquid resin containing magnetic metal grains is poured and filled, at a prescribed pressure, into the die using a dispenser, etc. Next, the liquid resin that has been filled into the die is dried under prescribed drying conditions, and then cured under prescribed curing conditions, to form a magnetic body part 14. Since the lead wires 44a, 44b and metal members 72a, 72b have been joined before the magnetic body part 14 is formed, as mentioned above, the lead wires 44a, 44b and metal members 72a, 72b are embedded in the element body part 10 constituted by the magnetic bodies 12, 14. Additionally, a die, release sheet, or other secondary material of an appropriate shape may be used to keep the liquid resin from filling the opening 74 in the metal member 72a or the opening 76 in the metal member 72b. It should be noted that, although Example 1 illustrated an example where the metal members 72a, 72b are each formed by a single metal plate, the present invention is not limited to this. The metal members 72a, 72b may each be formed by a combination of multiple metal plates. In this case, a part of the opening 74 may be provided in one of the multiple metal plates that form the metal member 72a, and the remainder of the opening 74 may be provided in the other metal plates. Similarly, a part of the opening 76 may be provided in one of the multiple metal plates that form the metal member 72b, and the remainder of the opening 76 may be provided in the other metal plates.

Next, the element body part 10 with the built-in coil 40 is removed from the die and the metal members 72a, 72b are bent onto the side faces 24a to 24d of the element body part 10. This way, the coil component 100 in Example 1 is formed.

Figure 4:
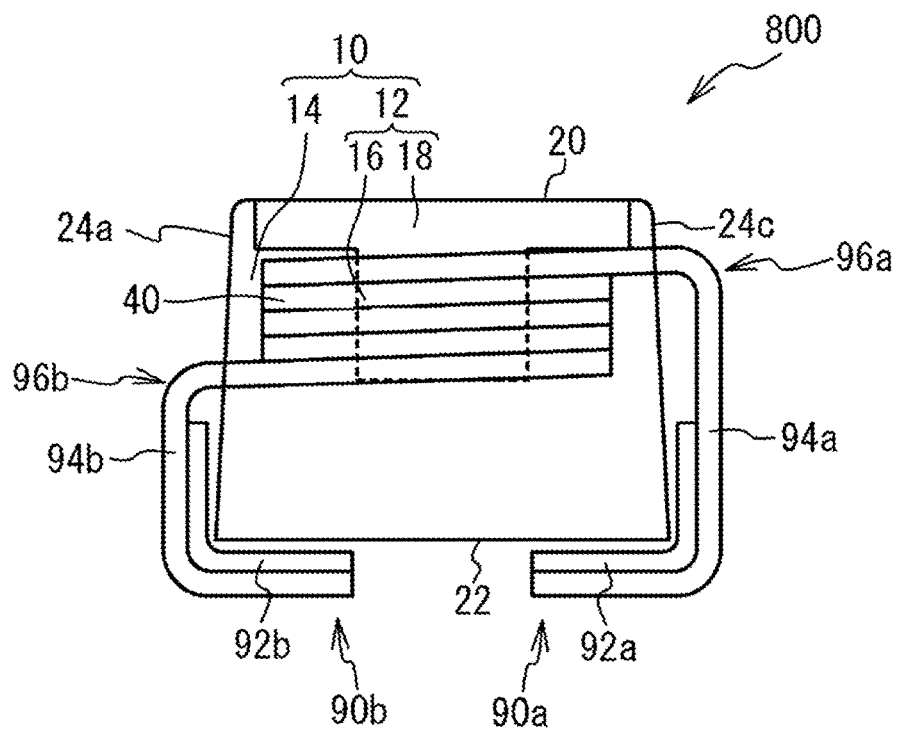
FIG. 4 is a perspective side view of the interior of the coil component pertaining to Comparative Example 1.

Before explaining the effects of the coil component 100 in Example 1, the coil components provided as comparative examples are explained. FIG. 4 is a perspective side view of the interior of the coil component pertaining to Comparative Example 1. As shown in FIG. 4, the coil component 800 in Comparative Example 1 is such that a lead wire 94a is led out from a side face 24c of an element body part 10 onto the exterior of the element body part 10, while a lead wire 94b is led out from a side face 24a of the element body part 10 onto the exterior of the element body part 10. Joined to the lead wire 94a is a plate-like metal member 92a so that it is positioned between the element body part 10 and the lead wire 94a, while joined to the lead wire 94b is a plate-like metal member 92b so that it is positioned between the element body part 10 and the lead wire 94b. The lead wire 94a and metal member 92a are bent in a manner extending on the exterior of the element body part 10 along the bottom face 22 from the side face 24c, to constitute a terminal part 90a. The lead wire 94b and metal member 92b are bent in a manner extending on the exterior of the element body part 10 along the bottom face 22 from the side face 24a, to constitute a terminal part 90b. The terminal parts 90a, 90b are not fixed to the element body part 10. The terminal parts 90a, 90b are not fixed to the element body part 10 partly to eliminate the need to consider the heat resistance of the adhesive otherwise used to fix them, and partly by considering the effect of stacking three layers, including the element body part 10, metal member 92a or 92b, and adhesive, each having a different coefficient of thermal expansion. In Example 1, too, preferably the effect of the difference between the coefficient of thermal expansion of the element body part 10 and that of the metal members 72a, 72b is considered; here, however, Comparative Example 1 provides a three-layer structure, while Example 1 provides a two-layer structure which allows for reduction of the effect of different coefficients of thermal expansion. The remaining constitutions are the same as those in Example 1 and therefore not explained.

Figure 5:
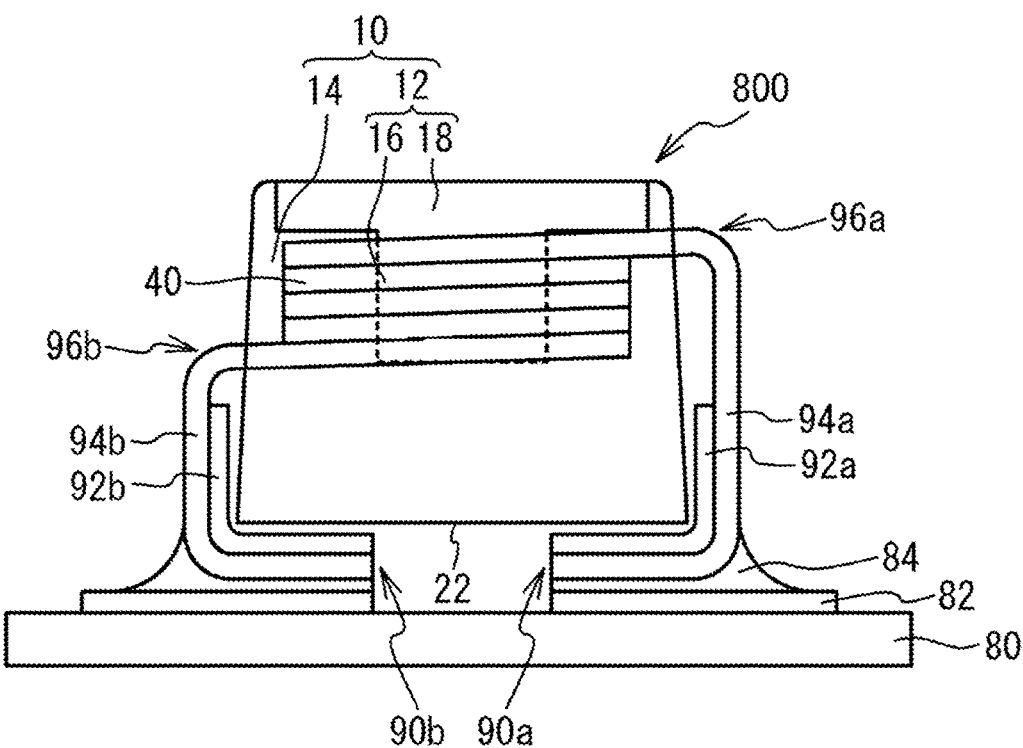
FIG. 5 is a drawing explaining problems that occur in the coil component pertaining to Comparative Example 1.

FIG. 5 is a drawing explaining problems that occur in the coil component pertaining to Comparative Example 1. As shown in FIG. 5, the coil component 800 in Comparative Example 1 is mounted on a circuit board 80 as a result of the terminal parts 90a, 90b of the coil component 800 joined to the electrodes 82 on the circuit board 80 by means of a mounting solder 84. In this case, the terminal parts 90a, 90b are joined to the circuit board 80 on the bottom face 22 side of the element body part 10, but not fixed to the element body part 10 on the bottom face 22 of the element body part 10. This means that the coil component 800 is suspended over the circuit board 80 in such a way that the areas 96a, 96b where the lead wires 94a, 94b are led out from the element body part 10 act as fulcrums. As a result, an application of vibration to the coil component 800 causes the areas 96a, 96b where the lead wires 94a, 94b are led out from the element body part 10 to receive a large force. As the areas 96a, 96b receive this large force, wire disconnection may occur in the areas 96a, 96b. If the coil component 800 is used in an automobile, industrial machinery, etc., for example, the coil component 800 is often subject to vibration and thus the lead wires 94a, 94b may receive large forces and eventually disconnect in the areas 96a, 96b where they are led out from the element body part 10. Furthermore, because the coil component 800 is suspended over the circuit board 80 in such a way that the areas 96a, 96b where the lead wires 94a, 94b are led out from the element body part 10 act as fulcrums, it has a certain resonance frequency of vibration. Vibration resistance tests required for automotive applications, etc., involve testing at various vibration frequencies, and the test vibration waves also contain harmonic components. Accordingly, the coil component 800 may resonate in these vibration tests, in which case the lead wires 94a, 94b may receive even larger forces, and eventually disconnect, near the areas 96a, 96b where they are led out from the element body part 10.

According to Example 1, on the other hand, the tip part 46a of the lead wire 44a, and the tip part 46b of the lead wire 44b, are fixed to the element body part 10 on the bottom face 22 of the element body part 10, as shown in FIGS. 2A to 2C. And, the metal member 72a is joined to the tip part 46a of the lead wire 44a on the bottom face 22 of the element body part 10, and also has an opening 74 at a position that overlaps the tip part 46a of the lead wire 44a. Similarly, the metal member 72b is joined to the tip part 46b of the lead wire 44b on the bottom face 22 of the element body part 10, and also has an opening 76 at a position that overlaps the tip part 46b of the lead wire 44b. This way, a terminal part 70a that includes the tip part 46a of the lead wire 44a and the metal member 72a is formed, and also a terminal part 70b that includes the tip part 46b of the lead wire 44b and the metal member 72b is formed.

As described above, the tip part 46a of the lead wire 44a constituting the terminal part 70a, and the tip part 46b of the lead wire 44b constituting the terminal part 70b, are fixed to the element body part 10. This means that, even when vibration is applied to the coil component 100 in a condition where its terminal parts 70a, 70b are joined to the electrodes on the circuit board, application of large force to any part of the lead wires 44a, 44b can be prevented because the coil component 100 is not suspended by the lead wires 44a, 44b over the circuit board. Also, when the coil component 100 is mounted on a circuit board via a solder, the opening 74 in the metal member 72a and opening 76 in the metal member 72b are filled by this solder, which allows the lead wires 44a, 44b to directly join with the solder. This improves the reliability of connection between the lead wires 44a, 44b and the electrodes on the circuit board, and also improves vibration resistance because the solder directly joins with the tip parts 46a, 46b of the lead wires 44a, 44b which are fixed to the element body part 10. Based on the above, vibration reliability can be effectively improved according to Example 1.

As shown in FIGS. 2A to 2C, preferably the tip part 46a of the lead wire 44a, and the tip part 46b of the lead wire 44b, are embedded in the element body part 10 on the bottom face 22 of the element body part 10, so that they are fixed to the element body part 10 on the bottom face 22 of the element body part 10. This way, the tip part 46a of the lead wire 44a, and the tip part 46b of the lead wire 44b, are securely fixed to the element body part 10, which further improves vibration reliability. It should be noted that the tip part 46a of the lead wire 44a, and the tip part 46b of the lead wire 44b, are not necessarily fixed to the element body part 10 by being embedded in the element body part 10 on the bottom face 22 of the element body part 10. The tip part 46a of the lead wire 44a, and the tip part 46b of the lead wire 44b, may be provided on the exterior of the element body part 10 on the bottom face 22 of the element body part 10 and fixed to the element body part 10 via an adhesive, etc., on the bottom face 22 of the element body part 10.

As shown in FIGS. 2A to 2C, preferably the tip part 46a of the lead wire 44a, and the tip part 46b of the lead wire 44b, extend along the bottom face 22 of the element body part 10. This way, the area of the portion 47a of the tip part 46a of the lead wire 44a positioned at the opening 74, and the area of the portion 47b of the tip part 46b of the lead wire 44b positioned at the opening 76, can be increased. This means that the solder used for mounting the coil component 100 on the circuit board joins with the lead wires 44a, 44b over larger areas, which further improves the vibration reliability.

As shown in FIGS. 2A to 2C, preferably the tip part 46a of the lead wire 44a is joined to the metal member 72a only on the side positioned on the bottom face 22 side of the element body part 10. Similarly, preferably the tip part 46b of the lead wire 44b is joined to the metal member 72b only on the side positioned on the bottom face 22 side of the element body part 10. In other words, the tip part 46a of the lead wire 44a is joined to the metal member 72a only in one direction, while the tip part 46b of the lead wire 44b is joined to the metal member 72b only in one direction. This way, the space needed to join the lead wire 44a and the metal member 72a, and the space needed to join the lead wire 44b and the metal member 72b, can be reduced, which means that the coil component 100 can be made smaller.

As shown in FIGS. 2A to 2C, preferably the tip part 46a and relay part 48a constituting the lead wire 44a are both embedded in the element body part 10. Similarly, preferably the tip part 46b and relay part 48b constituting the lead wire 44b are both embedded in the element body part 10. This way, vibration reliability can be improved further over when the lead wires 44a, 44b are led out to the exterior of the element body part 10. Also, the coil component 100 can be made smaller than when the lead wires 44a, 44b are led out to the exterior of the element body part 10.

As shown in FIGS. 2A to 2C, preferably the relay part 48a of the lead wire 44a is led out vertically to the bottom face 22 of the element body part 10, from the coil 40 toward the bottom face 22 of the element body part 10. This way, the coil component 100 can be made smaller. It should be noted that, if the relay part 48b of the lead wire 44b is long, then preferably the relay part 48b is led out vertically to the bottom face 22 of the element body part 10, from the coil 40 toward the bottom face 22 of the element body part 10, just like the relay part 48a.

As shown in FIGS. 2A to 2C, preferably the relay part 48a of the lead wire 44a is led out vertically to the bottom face 22 of the element body part 10, from the position at the end of winding of the coil 40 toward the bottom face 22 of the element body part 10. This way, the length of the lead wire 44a can be shortened, which in turn keeps the electrical resistance low. In addition, vibration reliability can be improved compared to when the lead wire 44a has a part which is led out toward a side face of the element body part 10. It should be noted that, if the relay part 48b of the lead wire 44b is long, then preferably the relay part 48b is led out vertically to the bottom face 22 of the element body part 10, from the position at the end of winding of the coil 40 toward the bottom face 22 of the element body part 10, just like the relay part 48a.

When the interior of the element body part 10 is viewed perspectively from the top face 20 side, preferably the coil 40 and lead wires 44a, 44b do not project outward from the metal members 72a, 72b, but are positioned on the inner side of the metal members 72a, 72b. This way, the coil component 100 can be made smaller.

As shown in FIGS. 1A to 1D and FIGS. 2A to 2C, preferably the parts of the metal members 72a, 72b positioned on the bottom face 22 of the element body part 10 are embedded in the element body part 10. This way, vibration reliability can be improved further. From the viewpoint of improving vibration reliability, preferably the parts of the metal members 72a, 72b positioned on the bottom face 22 of the element body part 10 are entirely embedded in the element body part 10 except for the undersides, and if the metal members 72a, 72b have a plated layer on the undersides, for example, preferably their entire parts are embedded inside the element body part 10 except for the plated layers on the undersides.

As shown in FIGS. 1A to 1D and FIGS. 2A to 2C, preferably the metal member 72a extends from the bottom face 22, to the side face 24b, of the element body part 10 and is positioned on the exterior of the element body part 10 on the side face 24b of the element body part 10. Similarly, preferably the metal member 72b extends from the bottom face 22, to the side face 24d, of the element body part 10 and is positioned on the exterior of the element body part 10 on the side face 24d of the element body part 10. This allows, when the coil component 100 is mounted on a circuit board, a solder fillet to be formed on the part of the metal member 72a bent onto the side face 24b of the element body part 10, and also on the part of the metal member 72b bent onto the side face 24d of the element body part 10.

Figure 6A:
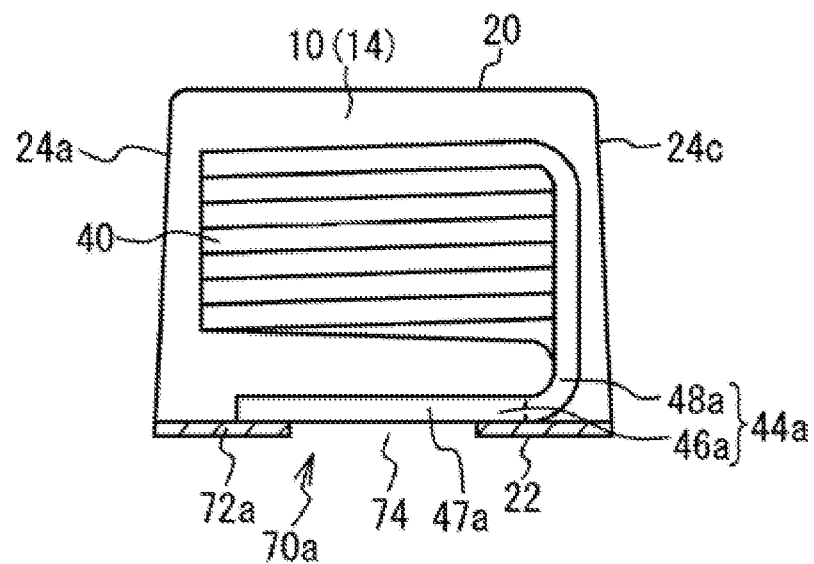
FIGS. 6A and 6B are perspective side views of the interior of the coil component pertaining to Variation Example 1 of Example 1.
Figure 6B:
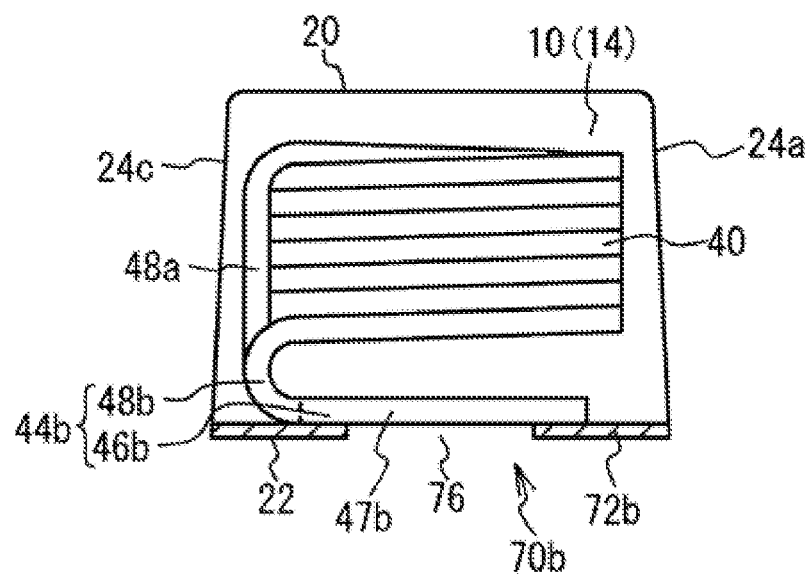

Although Example 1 illustrated an example where the element body part 10 is constituted by the magnetic body part 12 and magnetic body part 14, the present invention is not limited to this. FIGS. 6A and 6B are perspective side views of the interior of the coil component pertaining to Variation Example 1 of Example 1. It should be noted that, in FIGS. 6A and 6B, the metal members are hatched for illustrative clarity. As shown in FIGS. 6A and 6B, the element body part 10 may not have the magnetic body part 12; instead, it may be constituted only by the magnetic body part 14, in which this magnetic body part 14 is provided where the magnetic body part 12 is provided in Example 1. However, inductance and other electrical properties can be improved by using the magnetic body part 12 whose magnetic permeability is higher than that of the magnetic body part 14, and therefore preferably the element body part 10 is constituted by the magnetic body part 12 and magnetic body part 14.

Although Example 1 illustrated an example where the magnetic body part 12 has a T shape comprising the winding shaft 16 and the flange part 18 provided at one end of the winding shaft 16, it may also have an I shape comprising the winding shaft 16 and flange parts 18 provided at both ends of the winding shaft 16. If the magnetic body part 12 has an I shape, however, the lead wires 44a, 44b are positioned on the outer side of the flange parts 18 of the magnetic body part 12, which reduces the effect of improving electrical properties. Accordingly, preferably the magnetic body part 12 has a T shape and the flange part 18 is positioned on the opposite side, to the side on which the lead wires 44a, 44b are led out, of the coil 40. Also, from the viewpoint of improving electrical properties, preferably the flange part 18 of the T-shaped magnetic body part 12 is exposed on the top face 20 of the element body part 10.

Example 2

Figure 7A:
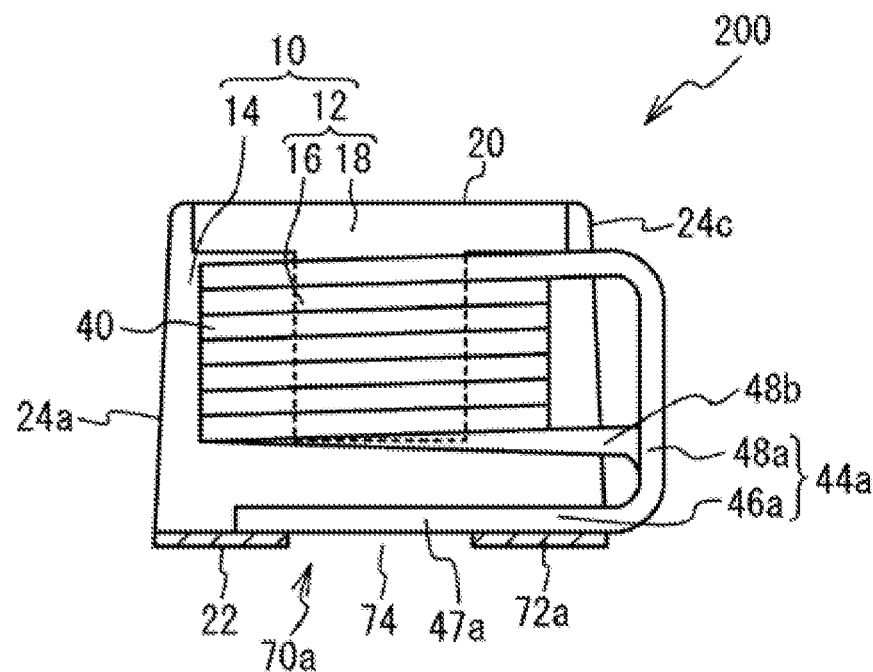
FIGS. 7A and 7B are perspective side views of the interior of the coil component pertaining to Example 2.
Figure 7B:
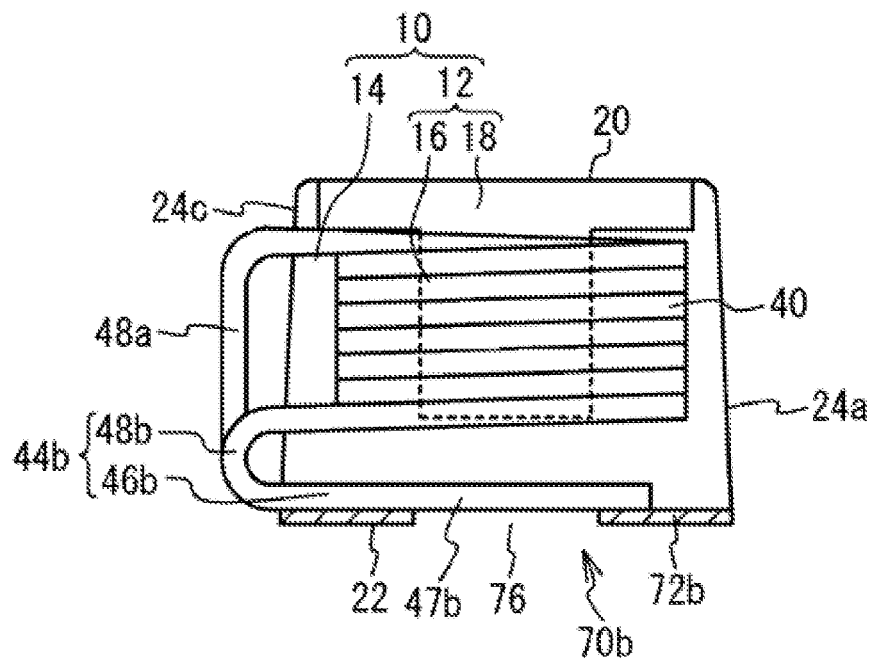

FIGS. 7A and 7B are perspective side views of the interior of the coil component pertaining to Example 2. It should be noted that, in FIGS. 7A and 7B, the metal members are hatched for illustrative clarity. As shown in FIGS. 7A and 7B, the coil component 200 in Example 2 is such that the relay part 48a of the lead wire 44a, and the relay part 48b of the lead wire 44b, are led out from the side face 24c of the element body part 10 to the exterior of the element body part 10. The relay part 48a of the lead wire 44a, and the relay part 48b of the lead wire 44b, are bent on the exterior of the element body part 10, while the tip part 46a of the lead wire 44a, and the tip part 46b of the lead wire 44b, are embedded in the element body part 10 and also extend along the bottom face 22 of the element body part 10. The remaining constitutions are the same as those in Example 1 and therefore not explained.

As shown in Example 2, the relay part 48a of the lead wire 44a, and the relay part 48b of the lead wire 44b, may be led out to the exterior of the element body part 10.

Example 3

Figure 8:
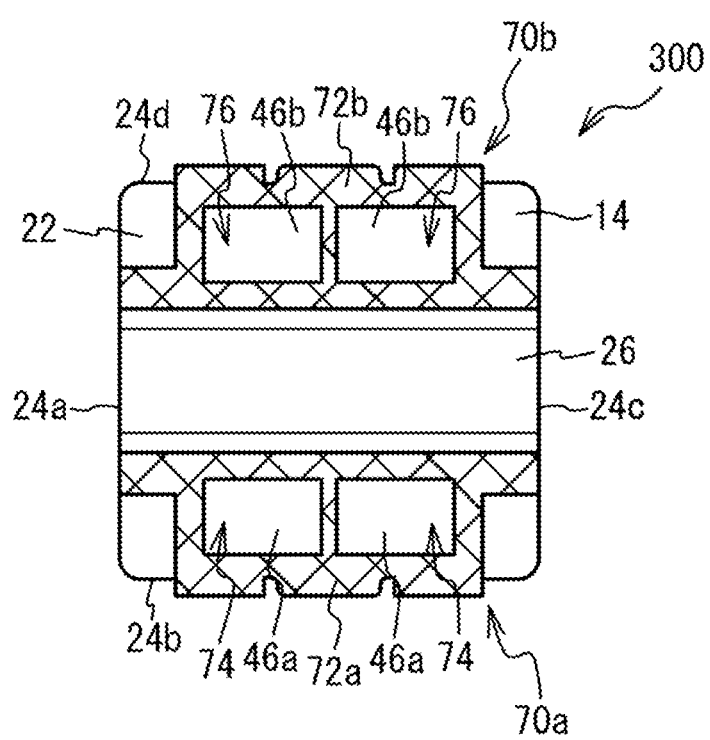
FIG. 8 is a bottom view of the coil component pertaining to Example 3.

FIG. 8 is a bottom view of the coil component pertaining to Example 3. It should be noted that, in FIG. 8, the metal members are hatched for illustrative clarity. As shown in FIG. 8, the coil component 300 in Example 3 has multiple openings 74 in the metal member 72a at positions that overlap the tip part 46a of the lead wire 44a, as well as multiple openings 76 in the metal member 72b at positions that overlap the tip part 46b of the lead wire 44b. The remaining constitutions are the same as those in Example 1 and therefore not explained.

When the coil component is mounted on a circuit board, for example, one consideration is to enlarge the openings 74, 76 to increase the joining strength, via the solder, between the lead wires 44a, 44b and the circuit board. However, enlarging the openings 74, 76 prolongs the time over which the wetting and spreading of the solder continues. This is why, in Example 3, multiple openings 74 are formed in the metal member 72a, and multiple openings 76 are formed in the metal member 72b. This way, the solder wetting/spreading time can be shortened while increasing the joining strength, via the solder, between the lead wires 44a, 44b and the circuit board.

Example 4

Figure 9A:
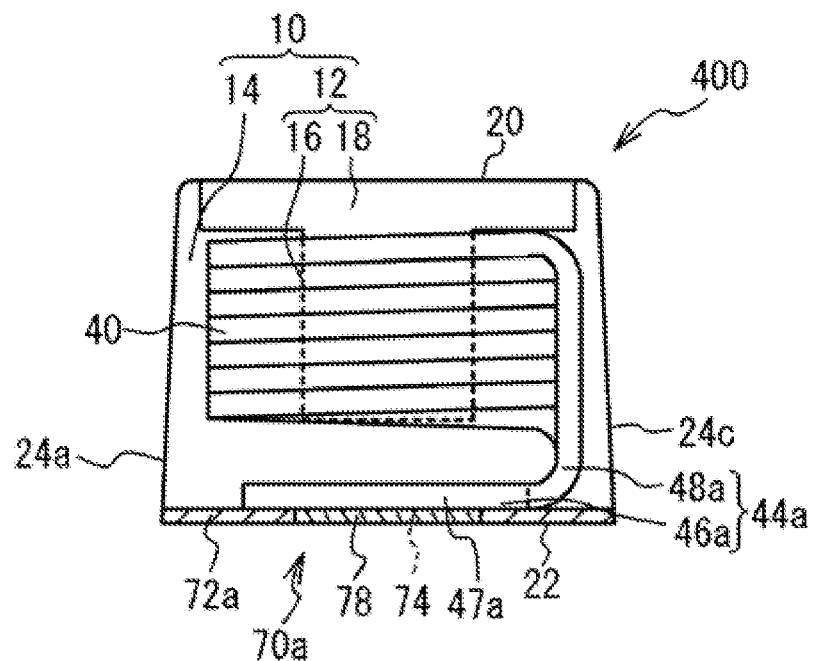
FIGS. 9A and 9B are perspective side views of the interior of the coil component pertaining to Example 4.
Figure 9B:
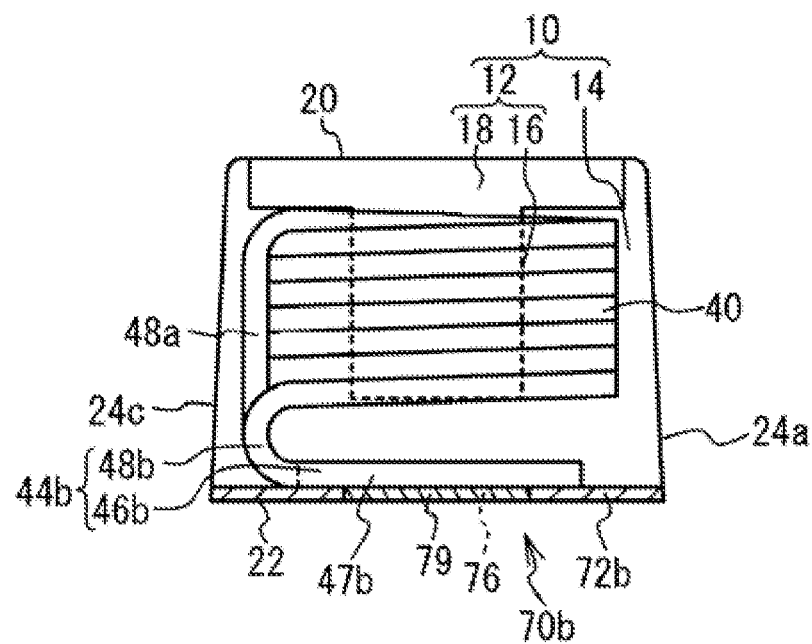

FIGS. 9A and 9B are perspective side views of the interior of the coil component pertaining to Example 4. It should be noted that, in FIGS. 9A and 9B, the metal members and solder are hatched for illustrative clarity. As shown in FIGS. 9A and 9B, the coil component 400 in Examples 4 is such that a solder 78 is filled in the opening 74 provided in the metal member 72a, while a solder 79 is filled in the opening 76 provided in the metal member 72b. As a result, the terminal part 70a is constituted in a manner including the tip part 46a of the lead wire 44a, the metal member 72a, and the solder 78, while the terminal part 70b is constituted in a manner including the tip part 46b of the lead wire 44b, the metal member 72b, and the solder 79. The remaining constitutions are the same as those in Example 1 and therefore not explained. It should be noted that the constitution where the solders 78, 79 are filled in the openings 74, 76 can be obtained according to the manufacturing method explained in connection with Example 1, where laser soldering or other solder joining method is used to join the tip part 46a of the lead wire 44a with the metal member 72a having the opening 74, and also to join the tip part 46b of the lead wire 44b with the metal member 72b having the opening 76. In other words, a solder is present in some or all of the space between the tip part 46a of the lead wire 44a and the metal member 72a, and also between the tip part 46b of the lead wire 44b and the metal member 72b.

If no solder is filled in the openings 74, 76 provided in the metal members 72a, 72b, as is the case of the coil component 100 in Example 1, air bubbles may generate in the openings 74, 76 when the coil component 100 is mounted on a circuit board using a solder (this solder used for mounting is hereinafter referred to as "mounting solder"), and consequently a mounting solder may not be properly filled in the openings 74, 76. For this reason, the coil component 400 in Example 4 is such that the solder 78 is filled in the opening 74 provided in the metal member 72a, while the solder 79 is filled in the opening 76 provided in the metal member 72b. The result of this is that, when the coil component 400 is mounted on a circuit board using a mounting solder, the lead wires 44a, 44b can be properly joined with the circuit board using the solders, 78, 79 and mounting solder. As described above, mounting the coil component 400 on a circuit board using a mounting solder causes the solders 78, 79 to melt and become one with the mounting solder, which effectively means that the portions of the tip parts 46a, 46b of the lead wires 44a, 44b positioned at the openings 74, 76 are directly connected to the circuit board as part of the terminals. This structure, where the lead wires 44a, 44b are directly connected to the circuit board, not through the intermediation of any separate member, can improve connection reliability.

In Example 4, the solders 78, 79 filled in the openings 74, 76 may have a lower height at the center due to surface tension. Accordingly, from the viewpoint of suppressing height reduction at the center of the solders 78, 79, the thickness of the metal members 72a, 72b (or specifically the depth of the openings 74, 76) is preferably 0.05 mm or greater but no greater than 0.2 mm, or more preferably 0.07 mm or greater but no greater than 0.18 mm, or yet more preferably 0.1 mm or greater but no greater than 0.15 mm. Also, when no solder 78, 79 is filled in the openings 74, 76, it becomes more difficult to properly fill the mounting solder in the openings 74, 76 as the openings 74, 76 become deeper. For this reason, the depth of the openings 74, 76 when the solders 78, 79 are filled, is preferably 0.05 mm or greater, or more preferably 0.1 mm or greater, or yet more preferably 0.15 mm or greater. The depth of the openings 74, 76 can be adjusted by the thickness of the metal members 72a, 72b. Also, the portion of the tip part 46a of the lead wire 44a positioned at the opening 74, and the portion of the tip part 46b of the lead wire 44b positioned at the opening 76, may be bent when they are embedded in the element body part 10 so as to reduce the depth of the openings 74, 76.

Although Examples 1 to 4 illustrated examples where the opening 74 in the metal member 72a, and the opening 76 in the metal member 72b, both have a rectangular shape when viewed from the bottom face 22 side of the element body part 10, the present invention is not limited to this. The openings 74, 76 may have a square shape, polygonal shape, circular shape, elliptical shape or any other shape.

Example 5

Figure 10A:
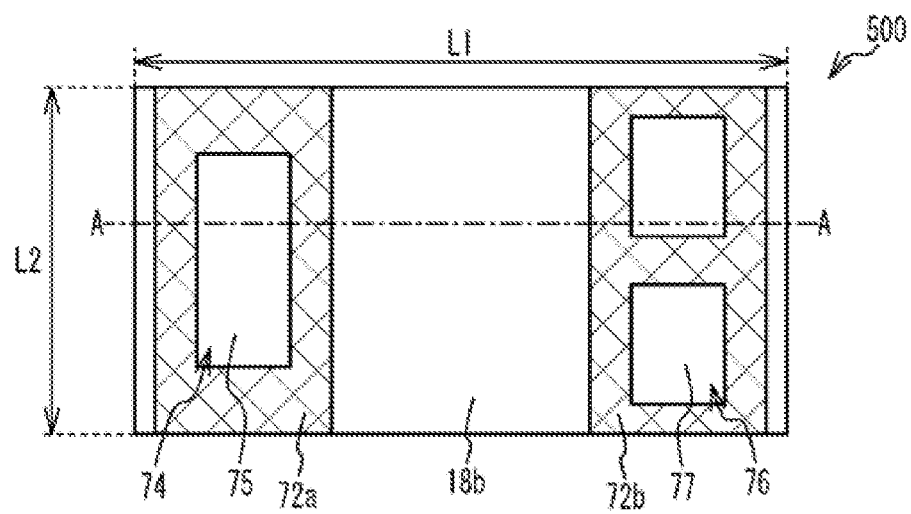
FIG. 10A is a bottom view of the coil component pertaining to Example 5.
Figure 10B:
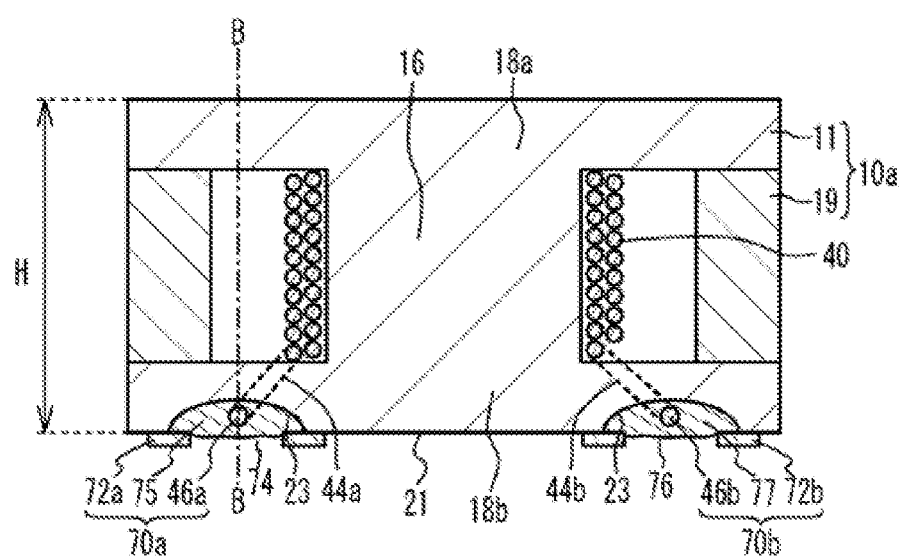
FIG. 10B is a cross-sectional view taken along line A-A in FIG. 10A.
Figure 10C:
FIG. 10C is a cross-sectional view taken along line B-B in FIG. 10B.

FIG. 10A is a bottom view of the coil component pertaining to Example 5, FIG. 10B is a cross-sectional view taken along line A-A in FIG. 10A, and FIG. 10C is a cross-sectional view taken along line B-B in FIG. 10B. It should be noted that in FIG. 10A, the metal members 72a, 72b are hatched for illustrative clarity. As shown in FIGS. 10A to 10C, the coil component 500 in Example 5 is such that the element body part 10a is a drum core 11 that includes a winding shaft 16 and a pair of flange parts 18a, 18b provided at both ends of the winding shaft 16 in the axial direction, and it may also be constituted in a manner including a resin part 19 being provided between the flange parts 18a, 18b. The winding shaft 16 has a columnar shape, for example. The flange parts 18a, 18b have a rectangular solid shape having a thickness in the axial direction of the winding shaft 16, for example. The winding shaft 16 has an underside diameter of approx. 0.8 mm, for example, and a height of approx. 0.42 mm, for example. The flange parts 18a, 18b have a thickness of approx. 0.18 mm, for example, while the drum core 11 has a height H of approx. 0.86 mm, for example. The principal faces of the flange parts 18a, 18b have a length L1 of approx. 2.0 mm in the long direction and a length L2 of approx. 1.2 mm in the short direction, for example. It should be noted that, regardless of the aforementioned dimensions, the ratio of the height (H) of the drum core 11 to the length (L1) of the principal faces of the flange parts 18a, 18b in the long direction, or H/L1, is smaller than 1 (H/L1<1).

The drum core 11 is formed containing a magnetic material, or specifically by a ferrite material, magnetic metal material, or resin containing a magnetic material. For example, it is formed by a Ni—Zn, Mn—Zn, or other ferrite material, Fe—Si—Cr, Fe—Si—Al, Fe—Si—Cr—Al or other soft magnetic alloy material, Fe, Ni or other magnetic metal material, amorphous magnetic metal material, nanocrystal magnetic metal material, or resin containing any of these magnetic materials. If the drum core 11 is formed by a crystal magnetic metal material, its grains may be insulated on their surface. The resin part 19 may be provided in a manner connecting the opposing faces of the flange parts 18a, 18b at the ends of the flange parts 18a, 18b of the drum core 11. The resin part 19 is formed containing a magnetic material, or by an epoxy resin that contains a ferrite material, for example.

The coil 40 is formed by a conductive wire being wound around the winding shaft 16. The resin part 19 may be provided around the drum core 11. In other words, the resin part 19 is provided in a manner surrounding the outer periphery of the coil 40 which has been formed by a conductive wire being wound around the winding shaft 16, while also covering it all around, at least partially, in the direction in which the conductive wire is wound. Accordingly, the coil 40 is built into the element body part 10a. It should be added that, even when the resin part 19 is not provided around the drum core 11, the coil 40 is provided in an area completely surrounded by and between the flange parts 18a, 19b of the drum core 11, which is to say that the coil 40 is built into the element body part 10a constituted by the drum core 11. As described above, the coil 40 may be built into the element body part 10a in two modes, including a mode where its periphery is completely surrounded by the element body part 10a, and a mode where it is partially not surrounded by the element body part 10a, but is substantially surrounded by the element body part 10a. Both ends of this conductive wire are led out from the coil 40 to become lead wires 44a, 44b. The conductive wire is a round wire having a circular cross-sectional shape, for example; however, other conductive wire, such as a rectangular wire having a rectangular cross-sectional shape, may be used.

The lead wires 44a, 44b are led out toward the bottom face 21 of the drum core 11, which is the face of the flange part 18b on the opposite side of the winding shaft 16, with the tip part 46a of the lead wire 44a, and the tip part 46b of the lead wire 44b, extending along the bottom face 21 of the drum core 11. It should be noted that the bottom face 21 of the drum core 11 becomes the bottom face of the element body part 10a. A concave 23 is formed on the bottom face 21 of the drum core 11, with the tip part 46a of the lead wire 44a, and the tip part 46b of the lead wire 44b, extending along the bottom face 21 of the drum core 11 inside the concave 23. Solders 75, 77 are filled in the concave 23. As a result, the tip part 46a of the lead wire 44a is fixed to the bottom face 21 of the drum core 11 by the solder 75 filled in the concave 23. The tip part 46b of the lead wire 44b is fixed to the bottom face 21 of the drum core 11 by the solder 77 filled in the concave 23. The solder 75 covers the periphery of the tip part 46a of the lead wire 44a, while the solder 77 covers the periphery of the tip part 46b of the lead wire 44b.

The metal members 72a, 72b are provided on the bottom face 21 of the drum core 11. The metal members 72a, 72b are not embedded in the bottom face 21 of the drum core 11; instead, they are provided on the bottom face 21 of the drum core 11. The metal member 72a is joined to the solder 75, while the metal member 72b is joined to the solder 77. Accordingly, the terminal part 70a is constituted by the tip part 46a of the lead wire 44a, the solder 75, and the metal member 72a. The terminal part 70b is constituted by the tip part 46b of the lead wire 44b, the solder 77, and the metal member 72b. The solder 75 is exposed through the opening 74 formed in the metal member 72a, while the solder 77 is exposed through the opening 76 formed in the metal member 72b. The remaining constitutions are the same as those in Example 1 and therefore not explained.

As shown in Example 5, the tip part 46a of the lead wire 44a, and the tip part 46b of the lead wire 44b, may be fixed to the bottom face 21 of the drum core 11 via the solders 75, 77. In this case, vibration reliability can also be improved.

As shown in FIG. 10B, the element body part 10a may be constituted in a manner including the drum core 11 that includes the winding shaft 16 and pair of flange parts 18a, 18b, and the resin part 19 provided between the flange parts 18a, 18b. The coil 40 may be formed by a conductive wire being wound around the winding shaft 16, and surrounded by the drum core 11 and the resin part 19. Also, the element body part may be constituted by the drum core 11 that includes the winding shaft 16 and pair of flange parts 18a, 18b. Also, the ratio of the height H of the drum core 11 to the length L1, in the long direction, of the principal faces of the flange parts 18b, 18b constituting the drum core 11, or H/L1, is preferably smaller than 1 (H/L1<1), or more preferably smaller than 0.8, or yet more preferably smaller than 0.6, or even more preferably smaller than 0.4. This way, the drum core 11 has a low profile, which improves vibration reliability.

Also, because the terminal part 70a is constituted by the tip part 46a of the lead wire 44a, the solder 75, and the metal member 72a, the smoothness of the solder 75 can be improved over when, for example, there is no metal member 72a, and the terminal part 70a is constituted by the tip part 46a of the lead wire 44a and the solder 75. The same goes with the terminal part 70b. This makes it easy to mount the coil component 500 on a circuit board.

Figure 11A:
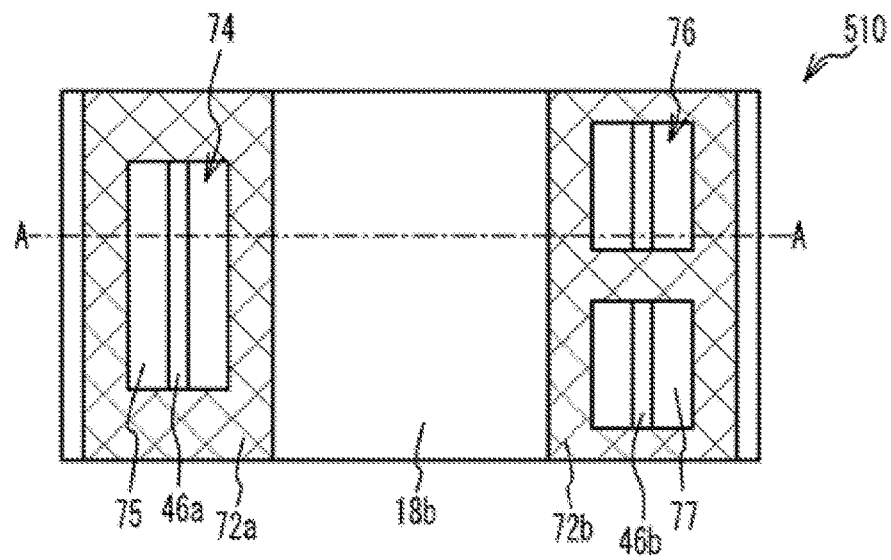
FIG. 11A is a bottom view of the coil component pertaining to Variation Example 1 of Example 5.
Figure 11B:
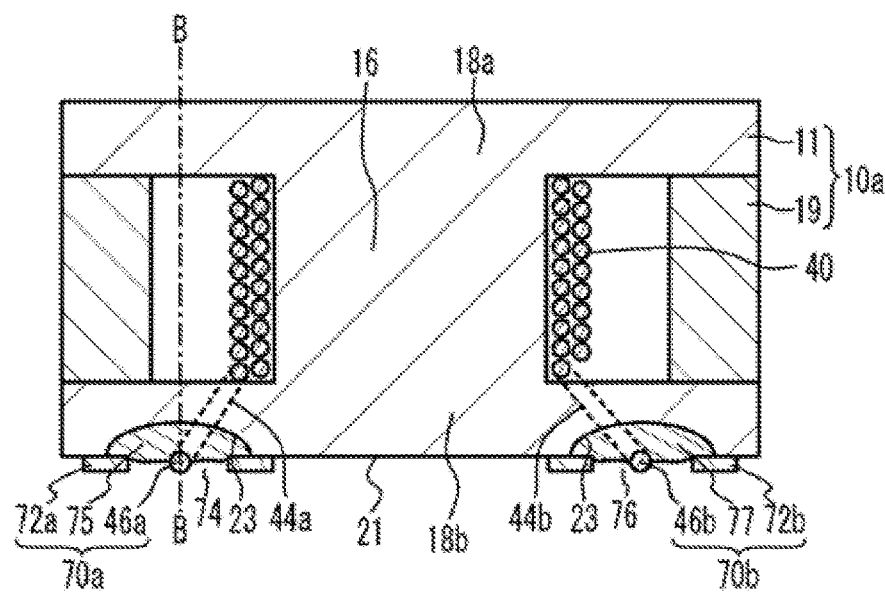
FIG. 11B is a cross-sectional view taken along line A-A in FIG. 11A.
Figure 11C:
FIG. 11C is a cross-sectional view taken along line B-B in FIG. 11B.
Figure 11C:
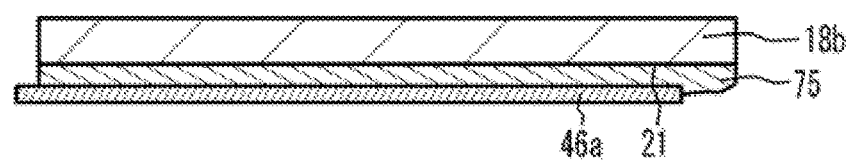

FIG. 11A is a bottom view of the coil component pertaining to Variation Example 1 of Example 5, FIG. 11B is a cross-sectional view taken along line A-A in FIG. 11A, and FIG. 11C is a cross-sectional view taken along line B-B in FIG. 11B. It should be noted that, in FIG. 11A, the metal members 72a, 72b are hatched for illustrative clarity. As shown in FIGS. 11A to 11C, the coil component 510 in Variation Example 1 of Example 5 is such that the tip part 46a of the lead wire 44a projects from the solder 75 at least partially in the diameter direction of the conductive wire, and is exposed to the opening 74 in the metal member 72a. Similarly, the tip part 46b of the lead wire 44b projects from the solder 77 at least partially in the diameter direction of the conductive wire, and is exposed to the opening 76 in the metal member 72b. The remaining constitutions are the same as those in Example 5 and therefore not explained.

According to Variation Example 1 of Example 5, the tip part 46a of the lead wire 44a and the tip part 46b of the lead wire 44b are exposed to the opening 74 in the metal member 72a and the opening 76 in the metal member 72b, respectively. This way, the mounting solder to be used when the coil component 510 is mounted on a circuit board, joins directly with the lead wires 44a, 44b. As a result, the reliability of connection between the lead wires 44a, 44b and the electrodes on the circuit board can be improved.

Figure 12A:
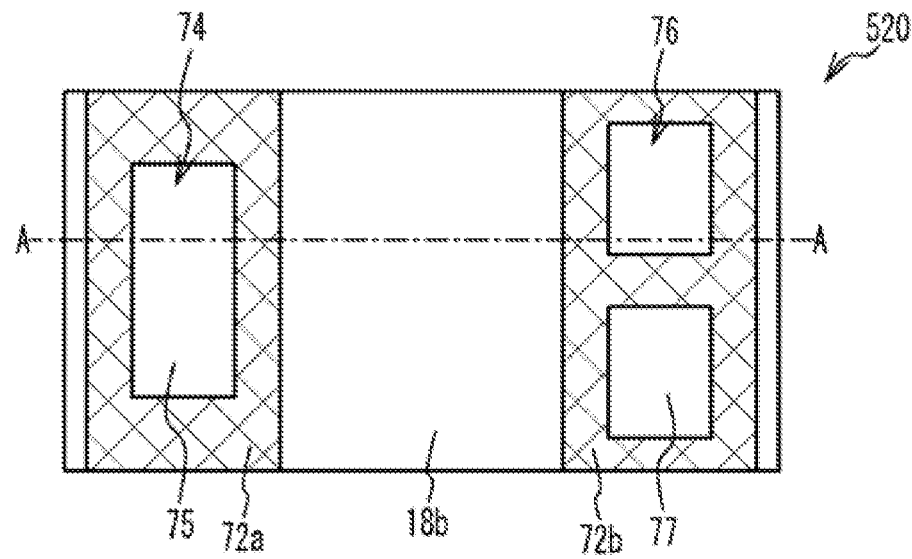
FIG. 12A is a bottom view of the coil component pertaining to Variation Example 2 of Example 5.
Figure 12B:
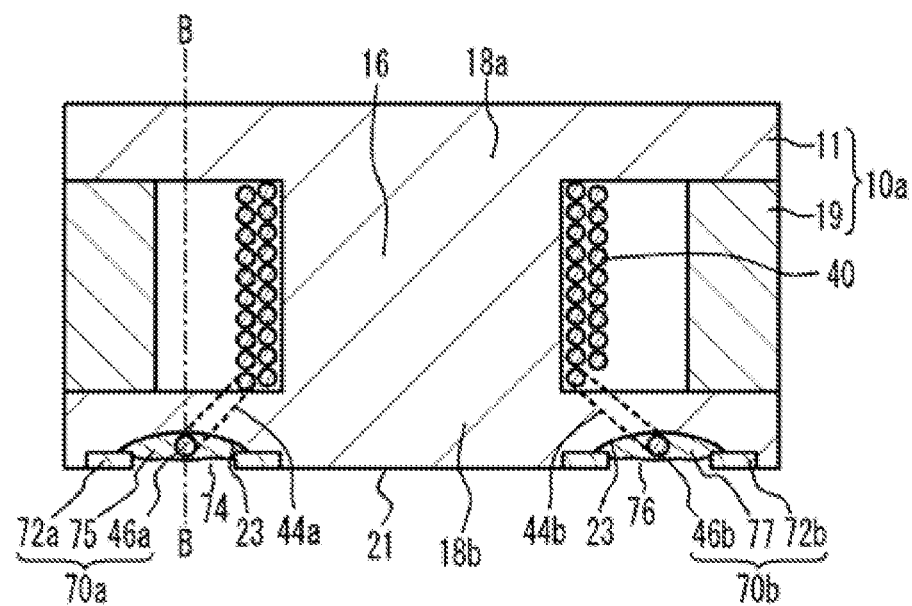
FIG. 12B is a cross-sectional view taken along line A-A in FIG. 12A.
Figure 12C:
FIG. 12C is a cross-sectional view taken along line B-B in FIG. 12B.
Figure 12C:
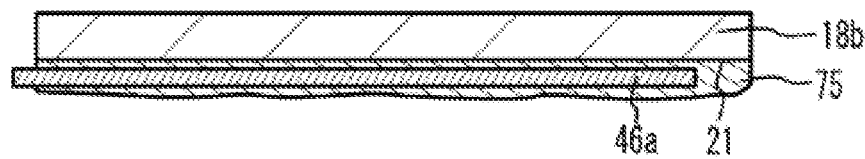

FIG. 12A is a bottom view of the coil component pertaining to Variation Example 2 of Example 5, FIG. 12B is a cross-sectional view taken along line A-A in FIG. 12A, and FIG. 12C is a cross-sectional view taken along line B-B in FIG. 12B. It should be noted that, in FIG. 12A, the metal members 72a, 72b are hatched for illustrative clarity. As shown in FIGS. 12A to 12C, the coil component 520 in Variation Example 2 of Example 5 is such that the metal members 72a, 72b are embedded in the bottom face 21 of the drum core 11 and their undersides are roughly flush with the bottom face 21 of the drum core 11. The remaining constitutions are the same as those in Example 5 and therefore not explained.

According to Variation Example 2 of Example 5, the metal members 72a, 72b are embedded in the bottom face 21 of the drum core 11 (in other words, the bottom face of the element body part 10a) in such a way that their undersides are roughly flush with the bottom face 21 of the drum core 11 (in other words, the bottom face of the element body part 10a), and therefore vibration reliability can be improved further. Also, because the bottom face of the element body part 10a is roughly flush with the undersides of the metal members 72a, 72b, the coil component 520 can be mounted on a circuit board in a manner achieving good stability. It should be noted that "roughly flush" is not limited to "completely flush," but it also includes cases where a step of a level of manufacturing error is formed.

Example 6

Figure 13A:
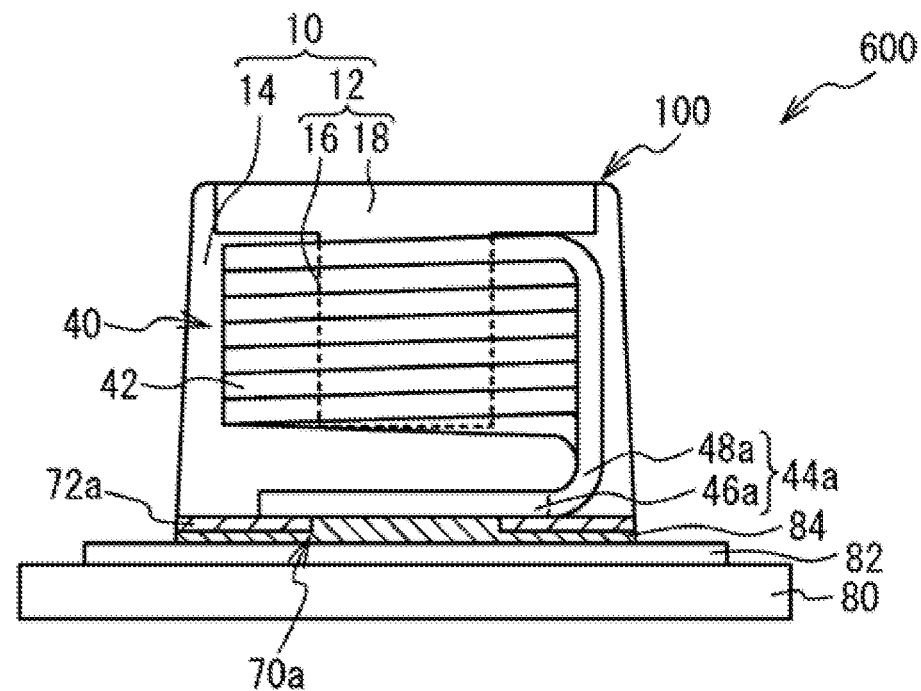
FIGS. 13A and 13B are perspective side views of the interior of the electronic device pertaining to Example 6.
Figure 13B:
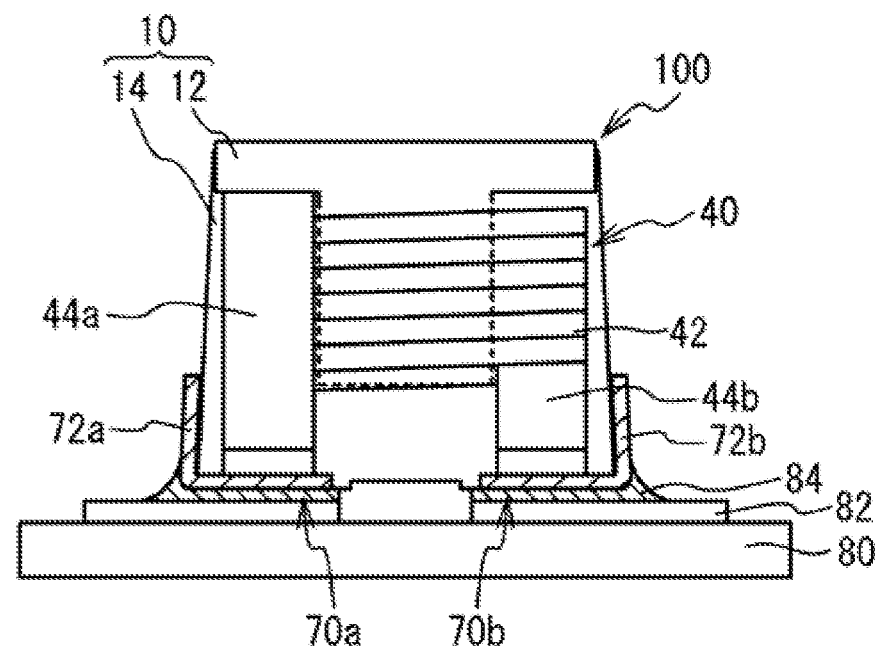

FIGS. 13A and 13B are perspective side views of the interior of the electronic device pertaining to Example 6. It should be noted that, in FIGS. 13A and 13B, the metal members and solder are hatched for illustrative clarity. As shown in FIGS. 13A and 13B, the electronic device 600 in Example 6 comprises the circuit board 80 and the coil component 100 in Example 1 being mounted on the circuit board 80. The coil component 100 is mounted on the circuit board 80 as a result of its terminal parts 70a, 70b being joined to the electrodes 82 on the circuit board 80 via the mounting solder 84.

According to the electronic device 600 in Example 6, the coil component 100 is mounted on the circuit board 80 as a result of the terminal parts 70a, 70b of the coil component 100 being joined to the electrodes 82 on the circuit board 80 via the mounting solder 84. This way, the electronic device 600 having the coil component 100 exhibiting improved vibration reliability can be obtained.

It should be noted that, although Example 6 illustrated an example where the coil component 100 in Example 1 is mounted on the circuit board 80, any of the coil components in Variation Example 1 of Example 1 through Variation Example 2 of Example 5 may be mounted. If the coil component 400 in Example 4 or any of the coil components 500 to 520 in Example 5 through Variation Example 2 of Example 5 is mounted on the circuit board 80, the solders 75, 77, 78, 79, and mounting solder 84 are constituted preferably by the same material, or more preferably by the same material having the same composition.

The foregoing described examples of the present invention in detail; it should be noted, however, that the present invention is not limited to these specific examples and that various modifications and changes can be added to the extent that doing so does not deviate from the key points of the present invention as described in "What Is Claimed Is."

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-252521, filed Dec. 27, 2017, and No. 2018-137384, filed Jul. 23, 2018, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A coil component, comprising:
   an element body part formed containing a magnetic material;
   a coil embedded within the element body part and constituted by a wound conductive wire;
   lead wires that are each extended from the conductive wire and led out from the coil, and whose tip parts are each fixed to the element body part on a first face among surfaces of the element body part; and metal members that are joined to the tip parts of the lead wires, respectively, on the first face, wherein the metal members are placed more outwardly than are the tip parts of the lead wires;

wherein terminal parts are each constituted by the tip part of the lead wire and the metal member joined to the tip part of the lead wire on the first face;

wherein the metal member has an opening at a position that overlaps the tip part of the lead wire in a direction that intersects the first face of the element body part.

2. The coil component according to claim 1, wherein the tip part of the lead wire is embedded in the element body part on the first face of the element body part and thereby fixed to the element body part on the first face of the element body part.

3. The coil component according to claim 1, wherein the tip part of the lead wire is fixed to the first face of the element body part via a solder.

4. The coil component according to claim 1, wherein the tip part of the lead wire extends along the first face of the element body part.

5. The coil component according to claim 1, wherein the metal member has multiple openings that each correspond to the opening.

6. The coil component according to claim 1, wherein the metal member has a solder filled in the opening; and the terminal part is constituted in a manner including the tip part of the lead wire, the metal member, and the solder.

7. The coil component according to claim 1, wherein the lead wires are each constituted by the tip part, and a relay part between the coil and the tip part; and the tip part and the relay part are both embedded in the element body part.

8. The coil component according to claim 7, wherein the relay parts of the lead wires are led out vertically to the first face of the element body part, from the coil toward the first face of the element body part.

9. The coil component according to claim 1, wherein, of the metal member, a part positioned on the first face of the element body part is embedded in the element body part.

10. The coil component according to claim 9, wherein a surface of the part of the metal member positioned on the first face of the element body part is roughly flush with the first face of the element body part.

11. The coil component according to claim 1, wherein the metal members extend from the first face, to a second face that intersects the first face, among surfaces of the element body part, and are placed on an exterior of the element body part on the second face.

12. The coil component according to claim 1, wherein the element body part includes a drum core that includes a winding shaft and a pair of flange parts provided at both ends of the winding shaft in the axial direction, and a resin part provided between the pair of flange parts; and the coil is formed by the conductive wire being wound around the winding shaft, and is surrounded by the drum core and the resin part.

13. The coil component according to claim 1, wherein the element body part is formed by a drum core that includes a winding shaft, and a pair of flange parts provided at both ends of the winding shaft in the axial direction; and the coil is formed by the conductive wire being wound around the winding shaft.

14. The coil component according to claim 12, wherein a ratio of a height of the drum core to a length of a principal face, in a long direction, of the flange part constituting the drum core, is smaller than 1.

15. An electronic device, comprising:

the coil component according to claim 1; and a circuit board on which the coil component is mounted;

wherein the terminal parts of the coil component are joined to electrodes provided on the circuit board.

* * * * *